United States Patent [19]
Ashiwake et al.

[11] Patent Number: 5,705,850
[45] Date of Patent: Jan. 6, 1998

[54] SEMICONDUCTOR MODULE

[75] Inventors: Noriyuki Ashiwake, Tsuchiura; Takahiro Daikoku, Ushiku; Kenichi Kasai, Hadano; Keizou Kawamura; Hideyuki Kimura, both of Tsuchiura; Atsuo Nishihara, Ibaraki-ken; Toshio Hatada, Tsuchiura; Toshiki Iino, Ibaraki-ken, all of Japan

[73] Assignee: Hitachi, Ltd., Tokyo, Japan

[21] Appl. No.: 290,155

[22] Filed: Aug. 15, 1994

[30] Foreign Application Priority Data

Sep. 20, 1993 [JP] Japan ................. 5-232796

[51] Int. Cl.⁶ .............. H01L 21/10; H01L 23/34; H02B 1/00; H02B 1/01
[52] U.S. Cl. .............. 257/714; 257/717; 257/719; 257/706; 257/722; 361/676; 361/697; 361/831
[58] Field of Search .................. 257/714, 697, 257/720, 723, 732, 712, 722, 731, 705, 706, 675, 717, 719; 361/676, 697, 831

[56] References Cited

U.S. PATENT DOCUMENTS

| | | |
|---|---|---|
| 4,106,523 | 8/1978 | Thornton . |
| 4,153,107 | 5/1979 | Antonetti et al. .............. 257/697 |
| 4,493,010 | 1/1985 | Morrison . |
| 4,765,400 | 8/1988 | Chu . |
| 4,800,956 | 1/1989 | Hamburgen .............. 361/387 |
| 5,005,638 | 4/1991 | Goth et al. .............. 361/386 |
| 5,057,968 | 10/1991 | Morrison .............. 361/385 |
| 5,345,107 | 9/1994 | Daikoku et al. .............. 257/712 |

FOREIGN PATENT DOCUMENTS

| | | | |
|---|---|---|---|
| 0088246 | 2/1983 | European Pat. Off. ...... H01L 23/433 |
| 0169270 | 12/1984 | European Pat. Off. ...... H01L 23/433 |
| 57-103337 | 6/1982 | Japan . |
| 59-231841 | 12/1984 | Japan .............. 257/722 |
| 60-126853 | 7/1985 | Japan . |
| 61-231744 | 10/1986 | Japan . |
| 63-127557 | 5/1988 | Japan .............. 257/697 |
| 1-102943 | 4/1989 | Japan .............. 257/722 |
| 2100351 | 4/1990 | Japan . |

OTHER PUBLICATIONS

Research Disclosure, vol. 336, No. 55, Apr. 1992, Havant GB p. 274 Anonymously.
IBM Technical Disclosure Bulletin, vol. 26, No. 293 (E-645) Aug. 10, 1984, New York pp. 4658-4660 Hassan et al.
Patent Abstracts of Japan vol. 12, No. 293, (E-645) Aug. 10, 1988 & JP A 63 070 545 Hitachi (30 Mar. 1988) abstract.
IBM Technical Disclosure Bulletin, Jan. 1969, vol. 11, Nr. 8 pp. 937-938 Interlock for Quick Release Fluid Couplings Integrated Module Heat Exchanger, IBM Technical Disclosure Bulletin, p. 4498, Apr. 1978.

Primary Examiner—Mahshid D. Saadat
Assistant Examiner—Jhihan B. Clark
Attorney, Agent, or Firm—Antonelli, Terry, Stout, & Kraus, LLP

[57] ABSTRACT

The disclosed invention aims at providing a semiconductor module structure which has a high ability of absorbing thermal deformation, is excellent in radiating ability and enables an easy maintenance operation. To this end, in the semiconductor module of the invention thermal conductor members are provided, each of which has an area of contact with a semiconductor device or an inner surface of a housing and has opposed heat transfer surfaces. A radiator is formed integrally on the housing. With this structure, large thermal deformation resulting from a high heat production density design can be absorbed, and at the same time heat from semiconductor devices can be efficiently radiated.

15 Claims, 5 Drawing Sheets

SEMICONDUCTOR MODULE

BACKGROUND OF THE INVENTION

This invention relates generally to a semiconductor module for use in an electronic device with a high heat generation density, and more particularly to a semiconductor module suited for use in such an electronic device as a large-size general-purpose computer and a super computer.

A module of the type in which flexible thermal conductors are provided between respective semiconductor devices and a housing, and heat generated from each semiconductor device is transferred to the housing through the associated thermal conductor to thereby effect cooling is disclosed, for example, in U.S. Pat. No. 5,005,638. In this conventional arrangement, cylindrical holes are formed in the housing at positions corresponding to respective chips therein, and a piston-like thermal conductor is fitted in each of the cylindrical holes. One end of each thermal conductor is urged by a spring into contact with the corresponding or associated semiconductor chip, so that heat from the chips is transferred to the housing. A water jacket for flowing cooling water is mounted on the housing, and the housing and the water jacket are separate in structure from each other.

In another conventional arrangement as disclosed in Japanese Patent Unexamined Publication No. 60-126853, planar or flat fins are interleaved with one another to form a thermal conductor. In this case, also, each thermal conductor is urged by a spring into contact with the surface of an associated semiconductor chip, but a housing itself has no radiation means, and a separate water jacket or the like is mounted on the housing.

Japanese Patent Unexamined Publication No. 61-231744 disclosed an arrangement in which each thermal conductor is urged by a spring into contact with both of an associated semiconductor chip surface and an inner surface of a housing. In this conventional arrangement, also, the housing itself is provided with no radiation means, and a separate water jacket or the like is mounted on the housing.

Japanese Patent Examined Publication No. 61-32819 discloses an arrangement in which thermal conductors, each having interleaved planar fins, are fixedly secured both to respective semiconductor chips and to the inner surface of a housing. In this conventional arrangement, also, the housing itself is not provided with radiating means, and a separate water jacket is mounted on the housing.

U.S. Pat. No. 4,800,956 discloses an arrangement in which thermal conductors, each having interleaved planar fins, are fixedly secured to both respective semiconductor chips and the inner surface of a housing, and a water jacket is formed integrally with the housing.

Japanese Patent Unexamined Publication No. 2-100351 discloses an arrangement in which a housing and a water jacket are formed integrally with each other, and a heat-conductive grease is filled in a gap between an inner surface of the housing and a surface of a semiconductor device.

The reason why the above-mentioned thermal conductors having resilience or flexibility are used for cooling the semiconductor devices mounted on a circuit board is as follows.

Generally, surfaces of semiconductor chips mounted on a circuit board do not lie in a common plane, and variations in height and tilt of the chips occur due to assembling accuracies. These are static displacement in an inoperative condition of the semiconductor devices. In an operative condition of the semiconductor devices, there occurs dynamic displacement, that is, thermal deformation due to a temperature distribution caused by the generated heat. Therefore, values of variations of height and tilt in the operative condition differ from those in the inoperative condition. The flexible thermal conductor functions to transfer heat from the semiconductor device to the housing while absorbing such static and dynamic displacement caused respectively by assembling accuracies and thermal deformation.

Thermal-conductive grease is known as a substitute technique for the above-mentioned flexible thermal conductors. In conventional semiconductor modules, a heat generation density per area of a circuit board is about 10 W/cm$^2$, and static displacement is predominant, and therefore the above prior art could satisfactorily deal with them. However, the heat generation density of a semiconductor module has been increasing from year to year, and it is expected that the heat generation density per area of a circuit board will reach 50–100 W/cm$^2$ in the near future.

In such a module with a higher heat generation density, the following points, which have offered only insignificant problems to the conventional modules with a heat generation density of about 10/W cm$^2$, become very serious.

One of these problems is thermal deformation of the module, that is, dynamic displacement. Generally, it is thought that the magnitude of thermal deformation in the direction of the thickness is proportional to a temperature gradient, that is, a heat generation density. With a conventional heat generation density of about 10 W/cm$^2$, the magnitude of thermal deformation in the direction of the thickness is about several microns, and this can be sufficiently absorbed by a thermal-conductive grease layer as disclosed, for instance, in Japanese Patent Unexamined Publication No. 2-100351. However, when the heat generation density becomes 5 to 10 times larger, it is expected that the magnitude of thermal deformation in the direction of the thickness will reach several tens of microns. On the other hand, an allowable thickness of the grease layer from the viewpoint of thermal resistance is about several tens of microns. It is quite difficult to absorb the dynamic displacement of several tens of microns in the direction of the thickness with the grease layer of several tens of microns.

For this reason, in a module of a high heat generation density which employs semiconductor devices generating a large amount of heat, it is difficult to use a simple grease layer as disclosed in Japanese Patent Unexamined Publication No. 2-100351, and it becomes essential to provide thermal conductors which can absorb greater dynamic displacement in the direction of the thickness than the grease layer can and are smaller in thermal resistance.

It is considered that the thermal conductors with opposite heat transfer surfaces as disclosed in U.S. Pat. No. 5,005,638, Japanese Patent Unexamined Publication No. 60-126853 and 61-231744 and Japanese Patent Examined Publication No. 61-32819 have a sufficient potential to meet with these requirements. However, even in these prior art techniques, sufficient consideration has not been given to the problem of dynamic displacement in the direction of the thickness involved by the higher heat generation density design of the module. In these conventional arrangements, the housing itself has no radiation means, and the radiator (for example, a water jacket) separate from the housing is mounted thereon. Separate provision of the housing and the radiator provides two advantages. One is to facilitate the processing or machining, and the other advantage is that when it becomes necessary to replace the module incorporated in the semiconductor equipment, the radiator can be removed from the module, and then only the module can be replaced.

In the conventional module with a heat generation density of about 10 W/cm², these advantages could be sufficiently enjoyed. This is because that the dynamic displacement is small with the conventional heat generation density as described above, and the static displacement such as variations in height and tilt of the semiconductor devices on the board is predominant. However, in the module with a higher heat generation density of 50–100 W/cm², the dynamic displacement in the direction of the thickness is larger, and therefore the housing itself is subjected to dynamic deformation, so that it is difficult for the housing to keep in intimate contact with the radiator (e.g. a water jacket).

The fact that the dynamic displacement in the direction of the thickness is thus increased in the module with a higher heat generation density of 50–100 W/cm² is a new issue which has not been taken into consideration in the conventional arrangements, and it is quite possible that the intimate contact will be adversely affected locally with the higher heat generation density of 50–100 W/cm², and a thermal resistance at these localized portions will exceed an allowable level. Therefore, it is necessary that the radiator, such as a water jacket, and the housing should be fastened to each other over their entire surfaces of contact by means of bolts or the like at a quite small pitch, and to this end, the thickness of the housing has to be increased to a certain degree. This offers an extremely serious problem in achieving a low thermal resistance necessary for the module with a higher heat generation density of 50–100 W/cm². In order to decrease the thermal resistance in the type of module which effects the cooling utilizing thermal conduction, it is most significant that the length of a heat transfer path from the semiconductor device to the radiator should be shortened and that a sufficient heat transfer area should be provided.

To increase the thickness of the housing as described above means that the length of the heat transfer path is increased, and the use of many bolts leads to the reduction of the heat transfer area. Therefore, with the conventional arrangements disclosed in U.S. Pat. No. 5,005,638, Japanese Patent Unexamined Publication Nos. 60-126853 and 61-231744 and Japanese patent Examined Publication No. 61-32819, it is thought to be difficult to cool the module with a higher heat generation density of 50–100 W/cm².

On the other hand, U.S. Pat. No. 4,800,956 discloses the arrangement in which the thermal conductors, each having interleaved planar fins, are fixedly secured both to the respective semiconductor chips and to the inner surface of the housing, and the water jacket is formed integrally with the housing. If this arrangement is applied to a module with a higher heat generation density of 50–100 W/cm², it is thought that dynamic displacement in the direction of the thickness can be absorbed, as described above. However, even in this arrangement, sufficient consideration has not been given to the problem of dynamic displacement due to thermal deformation.

More specifically, with the increase of a packaging density of a semiconductor equipment such as a large-size computer, a semiconductor module has been designed to have a larger area. In such a large-area module, thermal deformation (i.e., dynamic displacement) in the direction of the plane increases. In the arrangement disclosed in U.S. Pat. No. 4,800,956, since each thermal conductor is fixedly mounted on both the semiconductor chip and the inner surface of the housing, the dynamic displacement in the direction of the plane must be absorbed by gaps between the opposed fins of the thermal conductor. Therefore, as the dynamic displacement in the direction of the plane increases, the gap between adjacent fins need to be increased. This becomes an extremely serious problem in achieving a low thermal resistance necessary for the module with a higher heat generation density of 50–100 W/cm². In order to decrease the thermal resistance of a thermal conductor having opposed heat transfer surfaces, it is most essential to reduce the gap between the heat transfer surfaces. Accordingly, with the arrangement disclosed in U.S. Pat. No. 4,800,956, the reduction of the thermal resistance is limited.

As described above, the conventional arrangements do not give sufficient consideration to the problem of large dynamic displacement that is expected to be encountered with a future module having a large area and a higher heat generation density.

The other point, which has not been sufficiently considered in the prior art, and has not been so serious in the conventional modules with a heat generation density of about 10 W/cm² though it is expected to become extremely significant in the future module with a higher heat generation density of 50–100 W/cm², is a problem of thermal contact resistance.

More particularly, in the conventional module with a heat generation density of about 10 W/cm², since the total thermal resistance from the semiconductor devices to the radiator does not have to be so small, the thermal resistance of the contact between each semiconductor device and the associated thermal conductor member, as well as the thermal resistance of the contact between each thermal conductor member and the inner surface of the housing, has not become a significant issue.

For example, in the arrangements disclosed in U.S. Pat. No. 5,005,638 and Japanese Patent Unexamined Publication No. 60-126853, the surface of each semiconductor chip contacts associated one of the first thermal conductor members, and the second thermal conductor member is formed integrally with the housing. The first thermal conductor member is not fixedly secured to the semiconductor chip surface but is merely contacted therewith. This is to enable the thermal deformation in the direction of the plane to be absorbed and to facilitate the disassembling and assembling of the module. These arrangements have not posed any significant problem with the conventional module with a heat generation density of about 10 W/cm². However, in the future module with a higher heat generation density of 50–100 W/cm², in order to decrease the thermal resistance of the thermal conductor itself, the contact thermal resistance is relatively increased in its weight. In this connection, it is not thought from the following points that sufficient consideration has been given to the thermal contact resistance in the foregoing prior art arrangements.

One is a problem of the contact area. Generally, the area of each of many semiconductor devices installed on a board is smaller than that area of the board occupied by the semiconductor device, and the former area is the smallest of the cooling areas which the semiconductor device has. In order to decrease the thermal contact resistance, it is necessary to provide as large a contact area as possible. However, because the thermal contact resistance has not offered a significant problem in the conventional modules with a heat generation density of about 10 W/cm², the arrangements disclosed in U.S. Pat. No. 5,005,638 and Japanese Patent Unexamined publication No. 60-126853 employ the structure wherein the thermal conductors contact the respective surfaces of the semiconductor devices.

Another problem posed by the contact of the thermal conductors with the semiconductor device surfaces as in the conventional arrangements is warp of the semiconductor device surfaces. There is a tendency for a semiconductor device, such as an LSI chip, to have a larger area, and accordingly it has become very difficult to suppress the warp of the chip surface. The thermal contact resistance is greatly influenced by the warp of the contact surface, and therefore in the conventional arrangements it is extremely difficult to control the thermal contact resistance, and variations in radiating performance are increased.

SUMMARY OF THE INVENTION

It is a first object of the present invention to provide a semiconductor module having a cooling structure which overcomes the above problems of the prior art, and more specifically a semiconductor module which has a high ability of absorbing dynamic displacement due to thermal deformation and has an excellent radiating ability.

A second object of the invention is to provide a semiconductor module which is provided with a high-performance radiating structure and enables an easy maintenance operation.

A third object of the invention is to provide a semiconductor module provided with a radiating structure which has a high performance and is subjected to less variations in performance.

A fourth object of the invention is to provide a semiconductor module which is provided with a radiating structure excellent in electrically-insulating properties.

To achieve the above first object, the invention provides a semiconductor module which comprises a circuit board, a plurality of semiconductor devices mounted on the circuit board, a housing covering the circuit board, thermal conductor members provided between the respective semiconductor devices and the housing and each transferring heat from surfaces of the semiconductor devices to the housing, and a radiator formed integrally with the housing and radiating the heat transferred from the surfaces of the semiconductor devices to the housing.

A semiconductor module according to another aspect of the invention features that each of the thermal conductor members is contacted with an associated semiconductor device surface, holes are formed in the housing, the thermal conductor members are inserted in the respective holes of the housing with a gap left between each thermal conductor member and the associated hole, resilient members are interposed between the respective thermal conductor members and the housing, and a radiator is formed integrally on the housing to radiate the heat transferred from the surfaces of the semiconductor devices to the housing.

A semiconductor module according to still another aspect of the invention features that thermal conductor means comprises first thermal conductor members and second thermal conductor members, each of the first thermal conductor members has first fins formed on a base which is contacted with a semiconductor device surface, each of the second thermal conductor members has second fins formed on the housing, the first fins of each of the first thermal conductor members are engaged with the second fins of the associated second thermal conductor member, a resilient member is interposed between a surface of the base of each of the first thermal conductor members, from which the first fins extend, and a surface of the housing from which the second fins of the associated second thermal conductor member extend, and a radiator is formed integrally on the housing to radiate the heat transferred from the surfaces of the semiconductor devices to the housing.

It is preferable that the first fins of each of the first thermal conductor members are formed in a plate shape and arranged substantially perpendicularly to the surface of the associated semiconductor device, the second fins of each of the second thermal conductor members are also formed in a plate shape to be engaged with the first fins of the associated first thermal conductor member through minute gaps, and each of the first thermal conductor members is held in contact with the surface of the associated semiconductor device by a spring force of the associated resilient member. It is preferable for the housing that it has the radiator formed integrally on an outer surface thereof.

To achieve the second object, the invention provides a semiconductor module featuring that a housing has flow passages or channels formed therein and couplers of the valve-contained type are provided to connect and disconnect piping for supplying and discharging a cooling fluid relative to the channels.

It is also preferable for the semiconductor module according to the first aspect of the invention that the radiator includes a plurality of channels formed integrally in the housing and couplers of the valve-contained type for connecting and disconnecting piping for supplying and discharging a cooling fluid relative to the channels.

To achieve the third object, the invention provides a semiconductor module featuring that thermal conductor means comprises first thermal conductor members fixedly secured to the respective surfaces of the semiconductor devices and second thermal conductor members contacted with the inner surface of the housing. A semiconductor module according to another aspect of the invention features that each of the second thermal conductor members is formed with a hole in which associated one of the first thermal conductor members is received with a gap left between the first thermal conductor member and the hole and with a resilient member interposed between the first thermal conductor member and the second thermal conductor member, and a radiator is formed integrally on the housing to radiate heat transferred from the surfaces of the semiconductor devices to the housing.

A semiconductor module according to another aspect of the invention features that each of the first thermal conductor members having a base and first fins formed on the base, and each of the second thermal conductor members having a base brought into contact with the inner surface of the housing, and second fins formed on the base of the second thermal conductor members are engaged with the first fins of the associated first thermal conductor member with the resilient member interposed between the base of the first fins and that of the second fins, and each of the base of the second thermal conductor members is held in contact with the inner surface of the housing by a spring force of the associated resilient member. Preferably, the first fins of each of the first thermal conductor members are formed in a plate shape and disposed substantially perpendicularly to the surface of the associated semiconductor device, the second fins of each of the second thermal conductor members are also formed in a plate shape, and each of the base of the second thermal conductor members has an area almost equal to an area of the circuit board occupied by the associated semiconductor device. The radiator preferably comprises a plurality of fins formed integrally on the housing, and the inner surface of the housing is formed flat.

To achieve the fourth object, the invention provides a semiconductor module featuring that a thermally-conductive, electrically-insulative fluid is filled in a spaced which is defined by the circuit board and the housing.

Preferably, each of the first thermal conductor members fixedly secured to the respective semiconductor devices is made of a material which is electrically insulative and has a linear expansion coefficient close to that of a material of the semiconductor devices.

Because the semiconductor module is structured as above to attain the first object, heat transfer is effected by the thermal conductor members each of which has the surface for contact with the associated semiconductor device or the inner surface of the housing and has the opposed heat transfer surfaces, and the radiator is formed integrally on the housing. Accordingly, large thermal deformation resulting from a high heat generation density design can be absorbed, and at the same time heat from the semiconductor devices can be efficiently radiated.

In the semiconductor module structure as above to attain the second object, the couplers of the valve-contained type are provided on the housing which has the radiator formed integrally thereon. Accordingly, even if liquid such as water is used as the cooling fluid, the module can be easily removed from the semiconductor equipment, and replacement of the module in the event of the trouble or malfunction can be facilitated.

In the semiconductor module structured as above to attain the third object, the thermal conductor members are fixedly secured to the respective semiconductor devices and they are contacted with the inner surface of the housing. Accordingly, the contact area can be made large, and warp can be easily controlled, thereby reducing a thermal contact resistance.

In the semiconductor module structured as above to attain the fourth object, the thermally-conductive, electrically-insulative fluid filled in the space serves to ensure electrical reliability. The thermal conductor members fixedly secured to the respective semiconductor devices are made of a material which is electrically-insulative and has a linear expansion coefficient close to that of the material of the semiconductor devices, and therefore the radiating ability is enhanced while ensuring mechanical reliability for thermal deformation.

DESCRIPTION OF THE PREFERRED EMBODIMENTS

Figure 1:
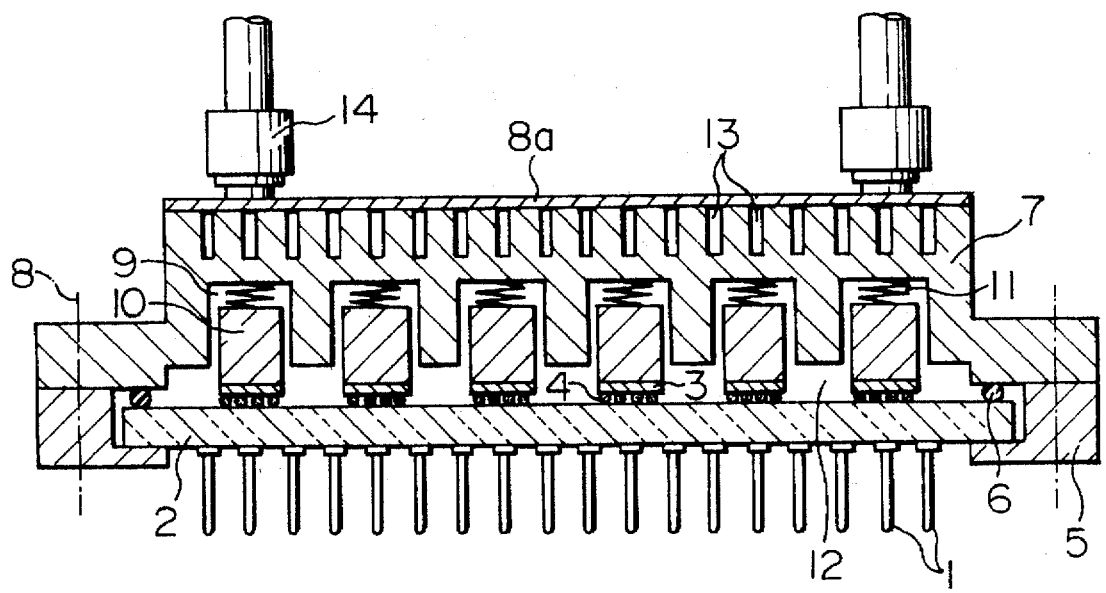
FIG. 1 is a vertical section view of a semiconductor module according to the first embodiment of the invention.

The first embodiment of the invention will now be described with reference to FIGS. 1 and 2. FIG. 1 is a vertical section view of a semiconductor module of this embodiment, and FIG. 2 is a view showing the manner of attaching couplers.

A plurality of semiconductor chips 3 are mounted through very small solder balls 4 on a multilayer board 2 of ceramics which has a number of I/O pins 1. A flange 5 is attached to the board 2, and the flange 5 is fixedly secured to a housing 7 with bolts 8 through an O-ring 6, so that a space 12 enclosed by the flange 5 and the board 2, in which the semiconductor chips lie, is hermetically sealed. Cylindrical holes 9 are formed in an inner wall or surface of the housing 7 at positions thereof respectively corresponding to positions where the semiconductor chips 3 are mounted. A piston-like heat transfer member 10 is received or fitted in each of the cylindrical holes 9 to be movable upward and downward. A spring 11 is interposed between one end of each piston-like heat transfer member 10 and the bottom of the associated cylindrical hole 9, and the other end of the heat transfer member 10 is abutted against the associated semiconductor chip 3. Thus, the heat transfer members 10 are pressed by the springs 11 against the respective surfaces of the semiconductor chips 3. Helium gas or a liquid, such as electrically-insulating oil, is filled in the space 12 enclosed by the housing 7 and the board 2. A plurality of flow passages or channels 13 for flowing a cooling fluid are formed integrally in an upper surface of the housing 7, and an upper lid 8a is attached to the housing 7 to cover these channels 13. Couplers 14, each of which contains a valve mechanism, are provided on the housing 7 or the upper lid 8a, and the cooling fluid from an outside supply flows into and out of the channels 13 via these couplers 14. The above valve mechanism serves to prevent the cooling fluid from flowing out of the space 12 even when the coupler 14 is disconnected.

The operation of the semiconductor module of this embodiment formed as above will now be described. The piston-like heat transfer members 10 are movable upward and downward in the respective cylindrical holes 9, and therefore they can absorb dynamic displacement in a direction of the thickness of the semiconductor module. Also, each heat transfer member 10 is head in contact with the corresponding semiconductor chip 3 to transfer heat, generated by the chip 3, to the housing 7. The surfaces of the semiconductor chip 3 and the piston-like heat transfer member 10 contacting each other transfer the heat, and at the same time absorb thermal deformation in a direction of the plane of the semiconductor module. Walls, which define the plurality of channels 13 in the housing 7, serve as radiating fins for transferring the heat, transferred to the housing 7, to the cooling fluid, and also they serve as reinforcement members for suppressing dynamic displacement of the housing 7. As a result, the length of the piston-like heat transfer members 10 can be shortened, the thickness of the housing 7 can be reduced, and the length of a heat transfer path from each semiconductor chip 3 to the cooling fluid can be shortened. Accordingly, the thermal resistance of the semiconductor module can be reduced, and even the semiconductor module with a heat generation density of 50 to 100 W/cm$^2$ can be cooled.

Figure 2:
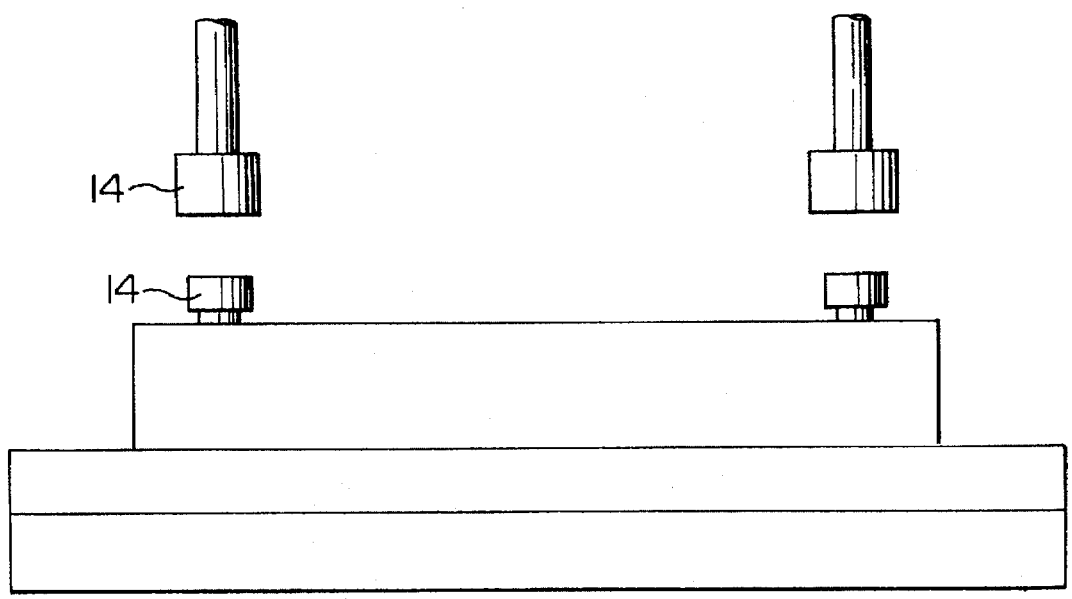
FIG. 2 is a view showing the manner of attaching couplers.

When it becomes necessary to remove the module from a semiconductor equipment, the couplers 14 are detached as shown in FIG. 2, and by doing so, the piping system of the cooling fluid and the module can be easily separated from each other. At this time, the cooling fluid will not flow out or leak since each coupler 14 is provided with the valve mechanism.

Figure 3:
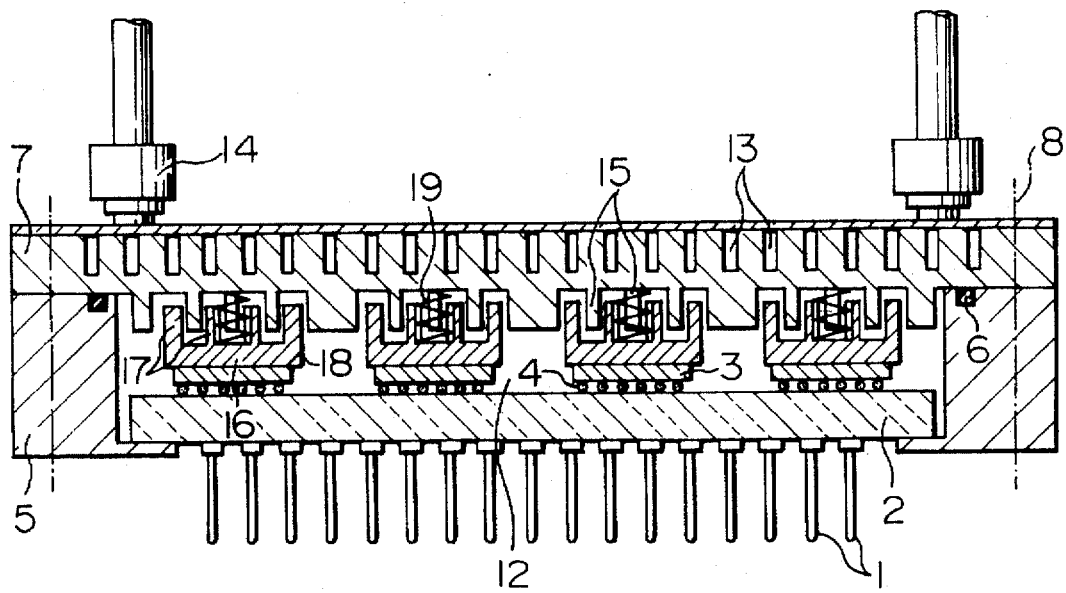
FIG. 3 is a vertical section view of a semiconductor module according to the second embodiment of the invention.

The second embodiment of the invention will be described with reference to FIG. 3. FIG. 3 is a vertical section view of a semiconductor module of this embodiment.

In the following description, elements and positions which may be similar to those of the first embodiment will be designated by the same reference numbers, and description thereof will be omitted.

In this embodiment, a plurality of second fins 15 are formed on the inner surface of a housing 7 exposed to a space 12. A thermal conductor member 18, having a base 16 and a plurality of first fins 17 thereon, is provided between each of semiconductor chips 3 and the housing 7, and the first fins 17 of the thermal conductor member 18 are interleaved or engaged with the second fins 15 in such a manner that the thermal conductor member 18 is movable upward and downward. Each thermal conductor member 18 has a slit for mounting a spring 19 on the first fins 17, and the spring 19 is installed such that the opposite ends of the spring 19 respectively abut against the bottom of the slit and the inner surface of the housing 7 from which the second fins 15 extend. Thus, the thermal conductor members 18 are urged by the springs 19 against the respective surfaces of the semiconductor chips 3, and the lower surfaces of the bases 16 are held in contact with the respective semiconductor chips 3. The other construction is the same as that of the first embodiment of FIG. 1.

In this embodiment, the area of facing between the first fins 17 and the second fins 15 can be made large, and therefore the thermal resistance can be further reduced as compared with the first embodiment.

Figure 4:
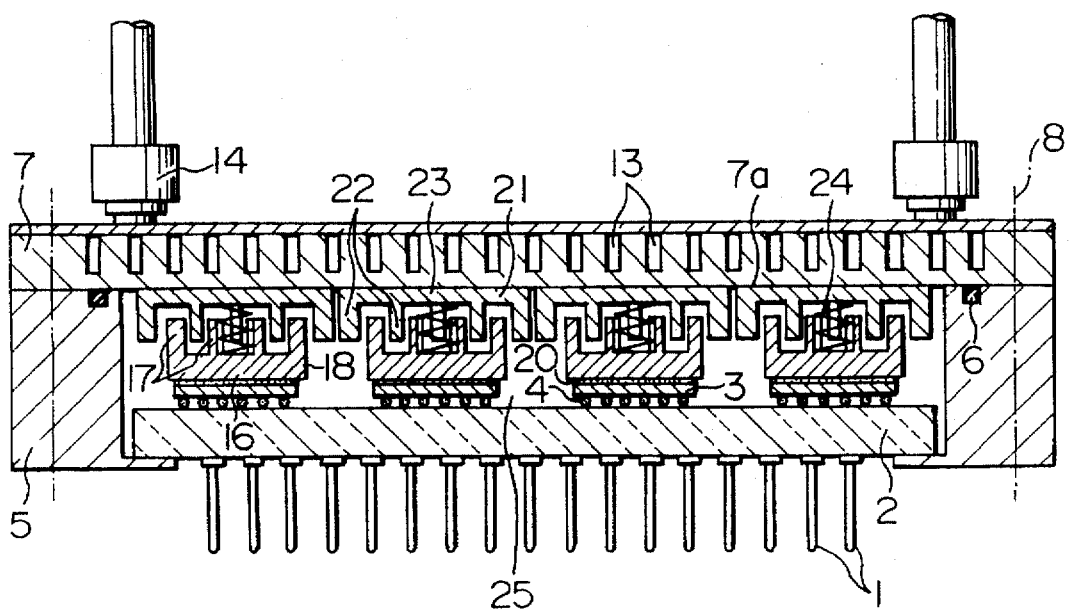
FIG. 4 is a vertical section view of a semiconductor module according to the third embodiment of the invention.
Figure 5:
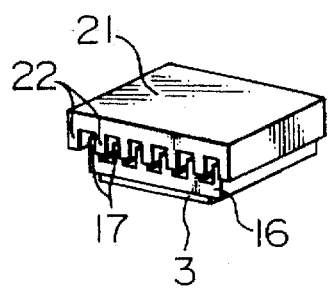
FIG. 5 is a perspective view showing a base and a base combined together.

The third embodiment of the invention will be described with reference to FIGS. 4 and 5. FIG. 4 is a vertical section view of a semiconductor module of the embodiment, and FIG. 5 is a perspective view showing a condition in which a base 16 and a base 21 are combined together.

As shown in FIG. 4, the construction of this embodiment in which semiconductor devices are mounted on a board 2 is similar to that of the embodiment of FIG. 3 in that channels 13 are formed in a housing 7, that couplers 14 are provided, and so on. However, unlike, the embodiment of FIG. 3 in which the second fins 5 are formed on the housing 7, in this embodiment, the bases 21 are provided as separate members, and the housing 7 is formed to have a flat inner surface 7a. A first thermal conductor member 18, having the base 16 and first plate-like fins 17 formed integrally with and extending perpendicularly from the base 16, is fixedly secured by a solder layer 20 to each of the semiconductor devices 3.

It is preferable that the first thermal conductor member 18 is formed of a material having electrically-insulating properties, a high thermal conductivity and a linear expansion coefficient close to that of the material of the semiconductor device. One example of such a material is aluminum nitride (AlN). Each of second thermal conducter members 23, having the base 21 and second plate-like fins 22, is engaged with a respective one of the first thermal conductor members 18 through minute gaps. The area of the base portion 21 of the second thermal conductor member 23 is almost equal to the area of the board 2 occupied by the associated semiconductor device 3, and the former area is larger than the area of the semiconductor device 3 itself. The base portion 21 of each second thermal conductor member 23 is pressed by a spring 24 against the flat inner surface 7a of the housing 7, and the surfaces of contact between the housing inner wall and the base portion of the second thermal conductor member 23 serve to transfer heat and to absorb deformation in a direction of the plane of the module. A fluid having electrically-insulating properties and a high thermal conductivity, such as helium gas or an oil, is filled in a space 25 enclosed by the board 2 and the housing 7.

Description will now be made on particular results of this embodiment. In this embodiment, each of the first thermal conductor members 18 is fixedly secured by the solder layer 20 to the associated semiconductor device 3, and therefore variations in contact thermal resistance due to warp of the device surface which can not be easily suppressed will not occur.

Because the area of the base portion 21 of each second thermal conductor member 23 is substantially equal to the area of the board 2 occupied by the associated semiconductor device 3, and because it is larger than the area of the semiconductor device 3 itself, the contact area can be made larger as compared with the case where a thermal conductor member is contacted with a device surface. Further, the inner wall of the housing 7, as well as the base portion of the thermal conductor member 23, is formed to have a flat surface which can be easily machined, and since this surface is a machined surface, warp can be suppressed quite easily. Accordingly, the base portions of the second thermal conductor members 23 are contacted with the flat inner wall 7a of the housing 7. Furthermore, the plurality of channels 13 machined or formed in the housing 7 serve as reinforcement members for suppressing deformation of the housing 7, thereby preventing warp of the flat surface 7a of the housing 7 from being caused by dynamic displacement due to thermal deformation. Accordingly, the base portions of the second thermal conductor members 23 are contacted with the flat inner wall 7a of the housing 7. Thanks to these three results, the thermal contact resistance can be kept at a very low level.

Figure 6:
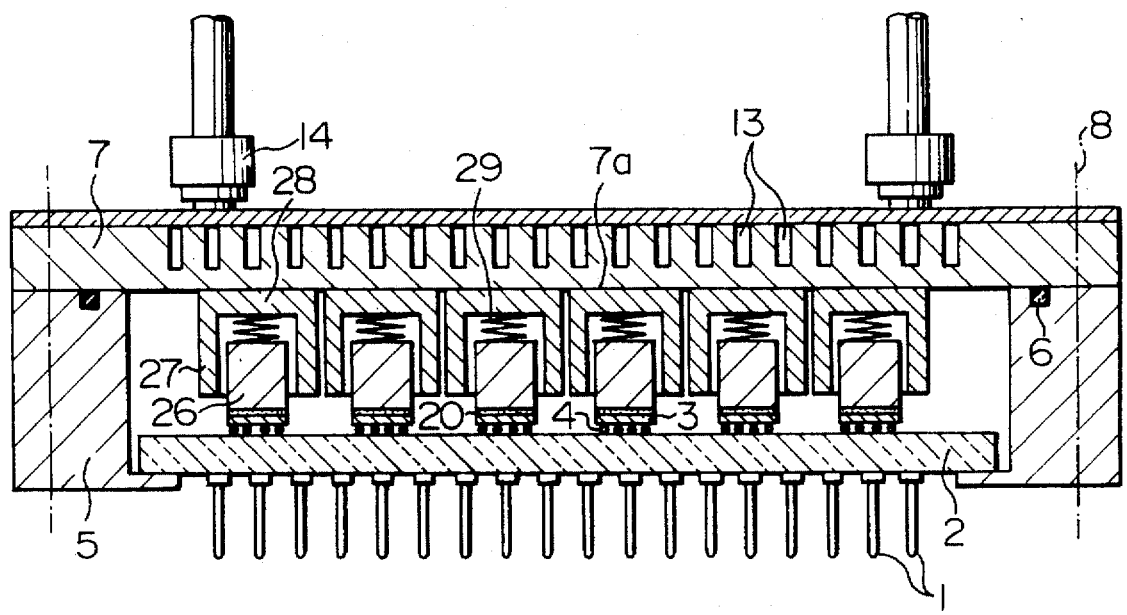
FIG. 6 is a vertical section view of a semiconductor module according to the fourth embodiment of the invention.
Figure 7:
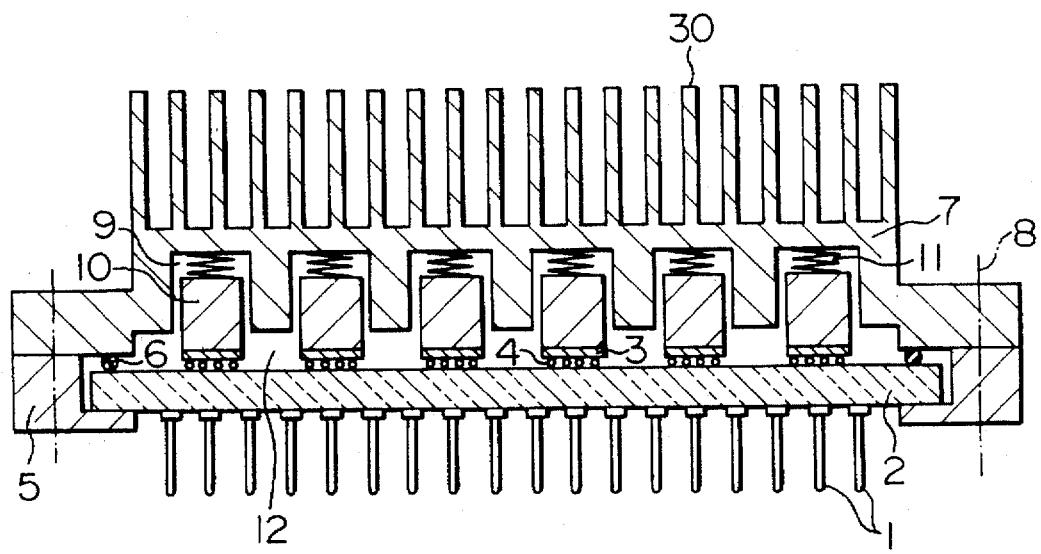
FIGS. 7 to 10 are vertical section views of semiconductor modules according to other embodiments of the invention, respectively.
Figure 8:
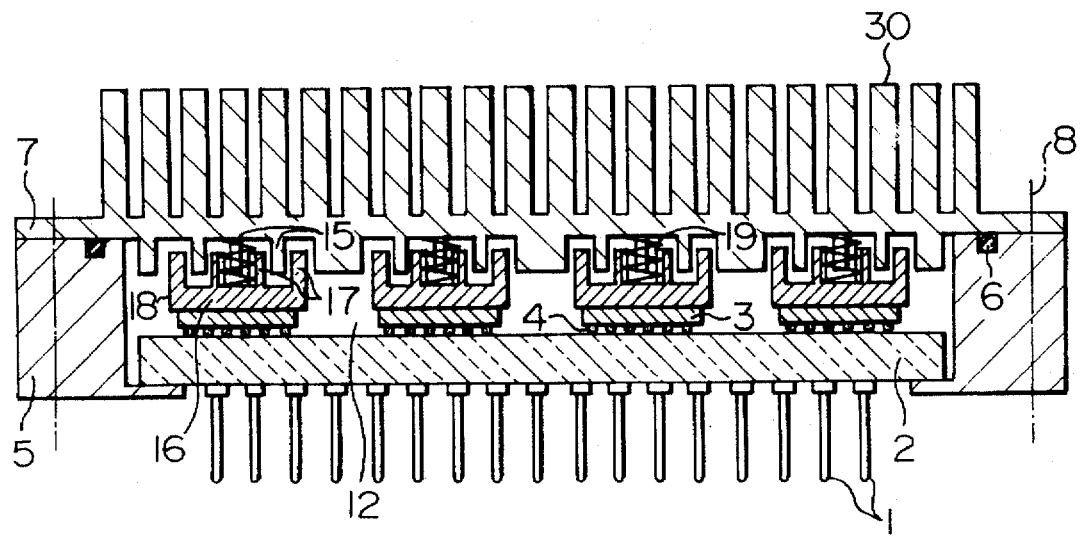
Figure 9:
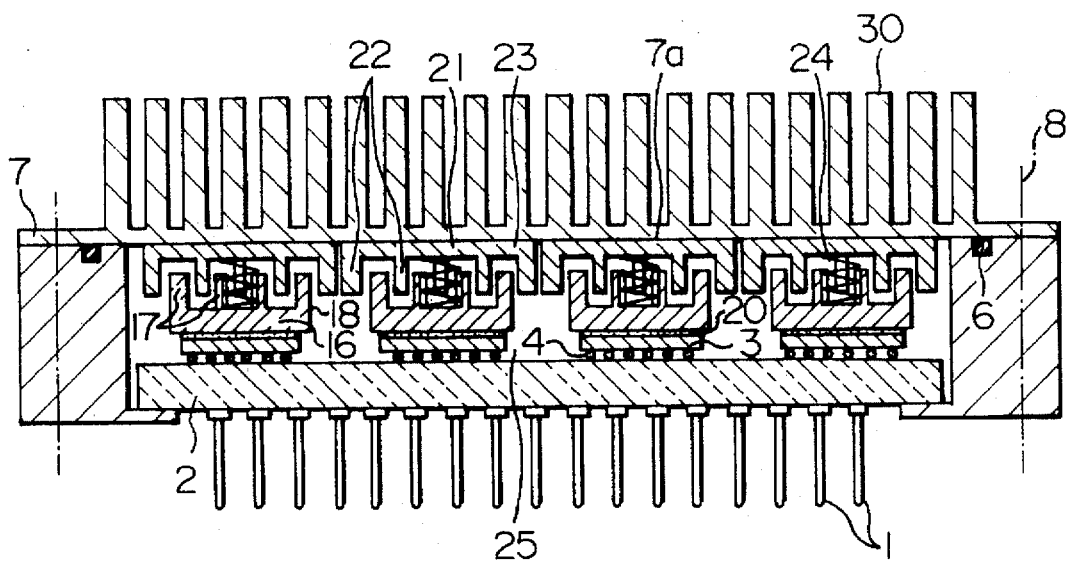
Figure 10:
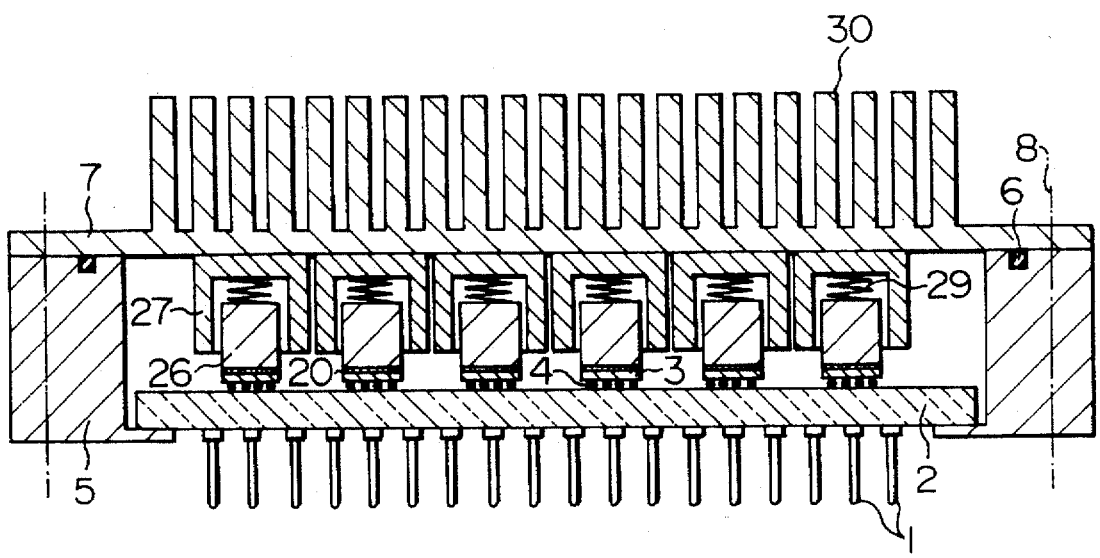

The fourth embodiment of the invention will be described with reference to FIG. 6. FIG. 6 is a vertical section view of a semiconductor module of this embodiment.

In this embodiment, each of first thermal conductor members, is in the form of a cylinder 26 which is fixedly secured at one end thereof by a solder layer 20 to an associated semiconductor chip 3, and each of second thermal conductor members is in the form of a cylindrical tube 27 with one end closed. A spring 29 is provided between the other end of the cylinder 26 and the bottom of the associated cylindrical tube 27 in which the cylinder is received, and under the force of the spring 29, a base portion 28 of the second thermal conductor member is urged into contact with a flat inner wall surface 7a of a housing 7 while the first thermal conductor member is urged in the direction of the semiconductor device 3, and deformation in a direction of the plane can be absorbed.

According to this embodiment, processing or machining of the thermal conductor members can be carried out more easily as compared with the embodiment of FIG. 4. Other advantages of this embodiment are the same as those of the embodiment of FIG. 4.

The first to fourth embodiments have been described that the couplers 14 are attached to the housing 7 and cooling is effected by flowing the cooling fluid through the channels 13. These embodiments, however, may be modified in such a manner that fins 30 are formed on the housing 7 for air-cooling purposes, as shown in FIGS. 7 to 10. Such a housing provided with the air-cooled fins brings about advantages that the cost can be reduced.

As described above, according to the invention, firstly, the thermal conductor members, which each include the opposed heat transfer surfaces having a high ability of absorbing dynamic displacement, are provided within the semiconductor module, and the radiating means is formed integrally with the housing, thereby overcoming the problem of the thermal resistance between the housing and the radiating means which is caused by the dynamic displacement of the housing itself. Therefore, a high radiating performance can be obtained while absorbing large thermal deformation expected to develop in the module with a higher heat generation density.

Secondly, the couplers each containing the valve mechanism are provided, and with this arrangement the maintenance operation of the module can be facilitated.

Thirdly, each semiconductor device is fixedly secured to the associated first thermal conductor member, and the associated second thermal conductor member is contacted with the inner surface of the housing. Accordingly, the contact thermal resistance can be kept at a low level while absorbing the thermal deformation in the direction of the plane, thereby achieving a high radiating performance.

In the fourth place, each thermal conductor member fixedly secured to the associated semiconductor device is made of an electrically-insulating material, and therefore a high radiating performance can be obtained without affecting electrical signals.

What is claimed is:

1. A semiconductor module comprising: a plurality of semiconductor devices mounted on a circuit board; a first thermal conductor member provided for each one of said semiconductor devices to be cooled and having a first base fixedly secured to the semiconductor device and first fins extending from said first base; a housing having a radiator for radiating heat generated by said semiconductor devices and accommodating said plurality of semiconductor devices; a second thermal conductor member provided for each one of said semiconductor devices to be cooled and having a second base having a first major surface and second fins extending from a second major surface of said second base; and a resilient member provided between said first fins and said second fins to bring said first major surface of said base of each of said second thermal conductor members into contact with an inner surface of said housing.

2. A semiconductor module according to claim 1, wherein said first fins of each of said first thermal conductor members are formed in a plate shape and arranged substantially perpendicularly to the surface of the associated semiconductor device, said second fins of each of said second thermal conductor members formed in a plate shape to be engaged with said first fins of the associated first thermal conductor member through minute gaps.

3. A semiconductor module according to claim 1, wherein said housing has said radiator formed integrally on an outer surface thereof, and the inner surface of said housing is formed flat.

4. A semiconductor module according to claim 1, wherein each second thermal conductor has an area substantially equal to an area of said circuit board occupied by the associated semiconductor device.

5. A semiconductor module according to claim 1, wherein said radiator provided on said housing comprises a plurality of fins formed integrally on said housing.

6. A semiconductor module according to claim 1, wherein each of said first thermal conductor members fixedly secured to the respective semiconductor devices is made of a material which is electrically insulative and has a linear expansion coefficient close to that of a material of said semiconductor devices.

7. A semiconductor module according to claim 1 wherein said radiator provided on said housing has a plurality of flow passages formed integrally in said housing for allowing a cooling medium to flow therethrough.

8. A semiconductor module according to claim 1, further comprising a thermally-conductive, electrically-insulative fluid filled in a spaced defined by said circuit board and said housing.

9. A semiconductor module comprising: a plurality of semiconductor devices mounted on a circuit board; a first thermal conductor member provided for each one of said semiconductor devices to be cooled and having a first surface fixedly secured to the semiconductor device; a housing having a radiator for radiating heat generated by said semiconductor devices and accommodating said plurality of semiconductor devices; a second thermal conductor member provided for each one of said semiconductor devices to be cooled, each second thermal conductor member having a first major surface and a second major surface and having a hole, said first thermal conductor member being inserted into said hole of said second thermal conductor member; and a resilient member provided between a second surface said first thermal conductor member and a surface of said second thermal conductor member within said hole to bring said first major surface of said second thermal conductor member into contact with an inner surface of said housing.

10. A semiconductor module according to claim 9, further comprising a thermally-conductive, electrically-insulative fluid filled in a spaced defined by said circuit board and said housing.

11. A semiconductor module according to claim 9, wherein said radiator provided on said housing comprises a plurality of fins formed integrally on said housing.

12. A semiconductor module according to claim 9, wherein each of said first thermal conductor members fixedly secured to the respective semiconductor devices is made of a material which is electrically insulative and has a linear expansion coefficient close to that of a material of said semiconductor devices.

13. A semiconductor module according to claim 9, wherein each of said second thermal conductor members has an area substantially equal to an area of said circuit board occupied by the associated semiconductor device.

14. A semiconductor module according to claim 9, wherein said housing has said radiator formed integrally on an outer surface thereof, and the inner surface of said housing is formed flat.

15. A semiconductor module according to claim 7, further comprising couplers with valves contained therein for connecting and disconnecting piping for supplying and discharging the cooling medium to and from said plurality of flow passages.

* * * * *